United States Patent [19]

Ryczek et al.

[11] Patent Number: 4,482,818

[45] Date of Patent: Nov. 13, 1984

[54] UNIVERSAL FIELD CONVERTIBLE 3-WIRE SWITCH

[75] Inventors: Lawrence J. Ryczek, Greendale; Donald L. Van Zeeland, Greenfield, both of Wis.

[73] Assignee: Eaton Corporation, Cleveland, Ohio

[21] Appl. No.: 367,150

[22] Filed: Apr. 9, 1982

[51] Int. Cl.³ .................. H03K 17/74; H03K 5/00
[52] U.S. Cl. .................................. 307/257; 307/127; 307/296 R; 328/26
[58] Field of Search .......... 307/257, 127, 262, 297 R; 328/26

[56] References Cited

U.S. PATENT DOCUMENTS

| | | | |
|---|---|---|---|
| 2,866,909 | 12/1958 | Trousdale | 307/257 |
| 3,041,475 | 6/1962 | Fisher, Jr. | 307/257 |
| 3,272,991 | 9/1966 | Lutsch et al. | 307/257 |
| 3,699,402 | 10/1972 | McCain et al. | 307/257 |
| 3,858,057 | 12/1974 | Martins | 307/257 |
| 4,273,039 | 9/1966 | Godshalk et al. | 307/127 |

Primary Examiner—Stanley D. Miller
Assistant Examiner—B. P. Davis
Attorney, Agent, or Firm—C. H. Grace; M. L. Union

[57] ABSTRACT

A universal 3-wire switch module is provided for normally open and/or normally closed load control modes. The universal switch module is field convertible from P type DC to N type DC to P type AC to N type AC configurations as programmed by installation wire connection, without internal changes to the switch module. A single switch module replaces the prior dedicated switch modules used for the various configurations. The switch module is further characterized by its versatile application to a wide range of voltage.

39 Claims, 8 Drawing Figures

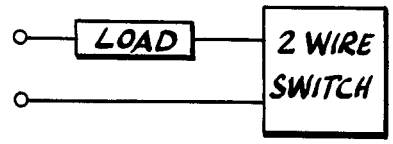
Fig. 1 PRIOR ART
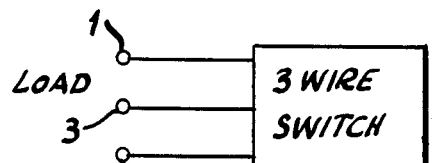
Fig. 2 PRIOR ART
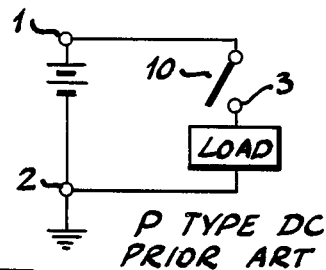
Fig. 3 P TYPE DC PRIOR ART
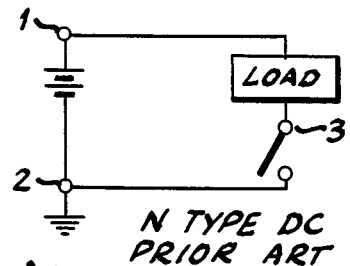
Fig. 4 N TYPE DC PRIOR ART
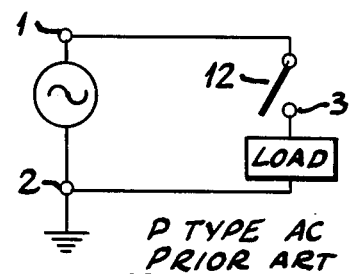
Fig. 5 P TYPE AC PRIOR ART
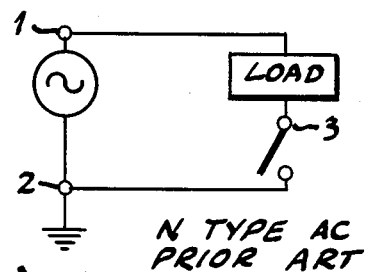
Fig. 6 N TYPE AC PRIOR ART
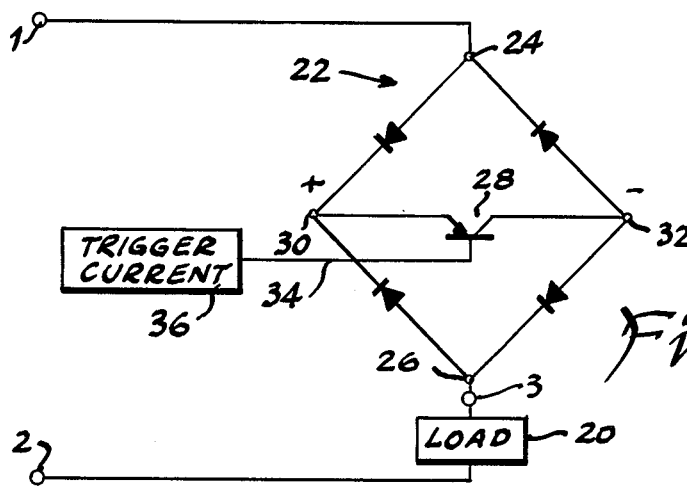
Fig. 7

UNIVERSAL FIELD CONVERTIBLE 3-WIRE SWITCH

BACKGROUND

The invention relates to 3-wire switches for connecting a load to a power supply. There are four types of configurations of 3-wire switches: (1) a P type DC switch where current flows from a DC source through the switch first and then to the load; (2) an N type DC switch where current flows from a DC source first through the load and then through the switch, such that the load is hot even when the switch is off; (3) a P type AC switch where the hot AC line is wired first through the switch and then through the load; and (4) an N type AC switch where the hot AC line is wired first through the load and then through the switch, such that the load is hot even when the switch is off.

An installer must stock three different switch modules to service these four configurations. One type of switch module services the P type DC configuration. A second different switch module services the N type DC configuration. A third switch module services both the P type AC and N type AC configurations.

SUMMARY

The present invention provides a single universal switch for servicing all four configurations. The switch is convertible in the field to any of the configurations without making internal changes to the switch. The switch is automatically converted from one configuration to another in accordance with the connection format of the three wires of the switch. The installer merely chooses which configuration is desired, and connects the power supply and load in the given connection pattern therefor. This installation connection wire programming is simple and efficient, and eliminates the need for stocking a plurality of dedicated switches as before.

In one aspect, the present invention evolved from efforts to provide versatile switching circuitry having the noted universal capability and also operable over a wide range of voltages.

Though not limited thereto, one such application is in proximity switch control circuitry wherein it is desired to use the output signal from a proximity switch to trigger or control a load across given power lines. The load control switch must tolerate a main current path which has large voltage swings. However, the voltage available from the proximity switch output signal is not large enough to match the triggering requirements of the load control switch.

In the preferred embodiment of the present invention, the available signal (which may be from a proximity switch) is used to throw another switch, such as an input transistor, to pass rectified line current to a conditioning circuit which then supplies predetermined drive requirement current for the load control switch, such as a load transistor, which then allows line current through the load.

The circuitry of the invention is particularly simple and effective and may be used to control one or more loads between the power lines.

In another aspect of the invention, the switching control circuitry enables a normally open or normally closed mode to be chosen individually for each load. The incoming signal may thus cause some loads to turn ON, while causing other loads to turn OFF.

BRIEF DESCRIPTION OF THE DRAWINGS

FIG. 1 is a schematic circuit diagram of a 2-wire switch.

FIG. 2 is a schematic circuit diagram of a 3-wire switch.

FIG. 3 is a schematic circuit diagram of a P type DC switch configuration.

FIG. 4 is a schematic circuit diagram of an N type DC switch configuration.

FIG. 5 is a schematic circuit diagram of a P type AC switch configuration.

FIG. 6 is a schematic circuit diagram of an N type DC switch configuration.

FIG. 7 is a schematic circuit diagram of a basic building block switch configuration useful for teaching the present invention.

Detailed Description

Figure 8:
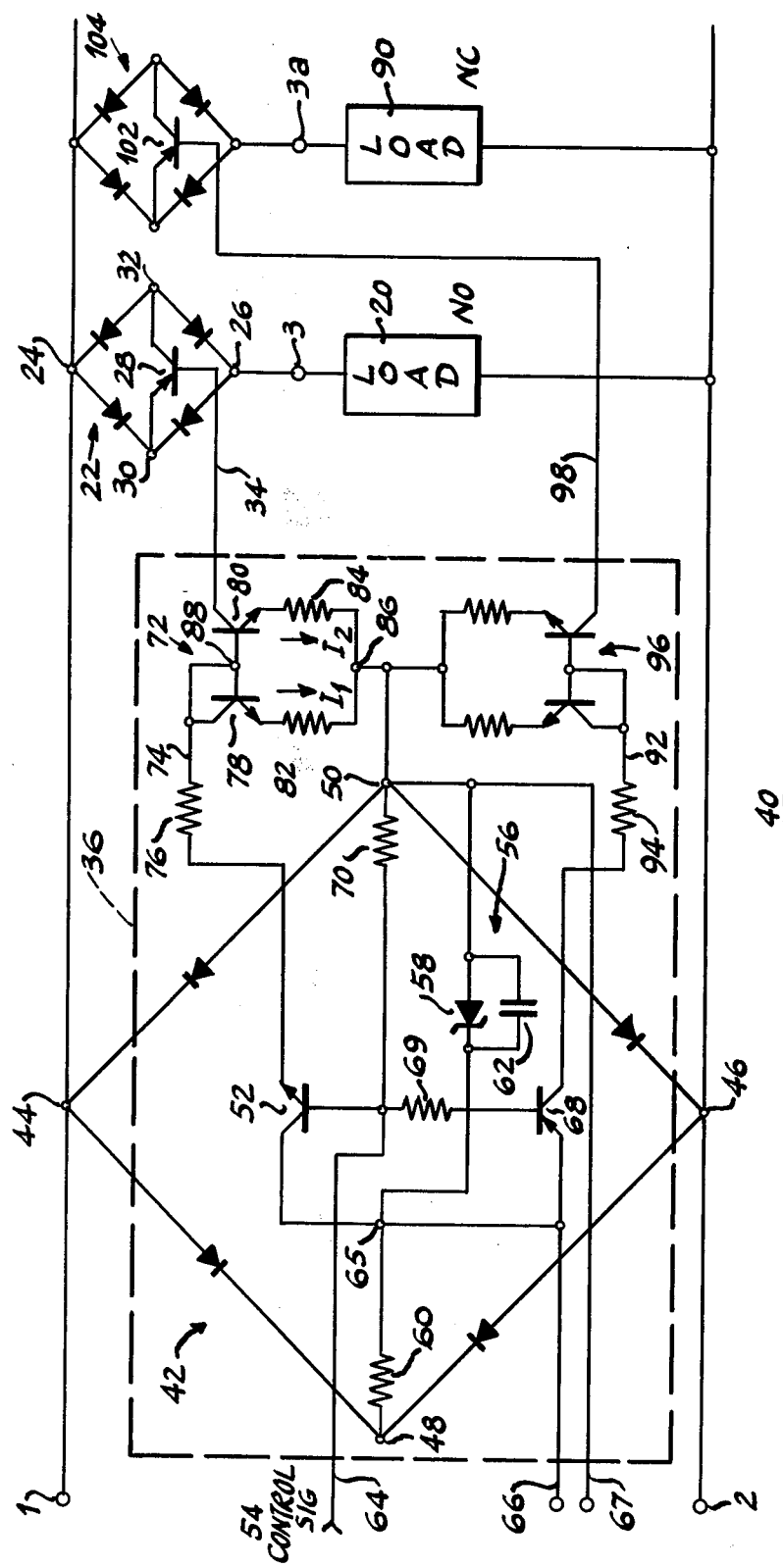
FIG. 8 is a schematic circuit diagram of a universal switch constructed in accordance with the invention.

FIG. 1 shows a 2-wire switch having two wires or terminals for connection to a power supply for controlling load current. FIG. 2 shows a 3-wire switch having first and second main terminals or wires 1 and 2 for connection to a power supply, and having a third load terminal or wire 3 for connection to a load. The present invention relates to a 3-wire switch.

FIGS. 3 through 6 illustrate the four types of configurations of the 3-wire switch of FIG. 2, and the three wires or terminals are labeled comparably to FIG. 2 to facilitate clarity.

FIG. 3 shows a P type DC configuration switch, with main terminal 1 connected to the positive side of a DC power supply such as a battery, and main terminal 2 connected to the negative side of the battery, which terminal may also be grounded. A switch is placed in series between the load and terminal 1 such that current flows through the switch fifst and then the load back to terminal 2 or to ground. FIG. 4 shows an N type DC switch configuration, with current flowing from terminal 1 first through the load and then through the switch back to terminal 2. In this configuration, the load is still hot even with the switch OFF. FIG. 5 shows a P type AC switch with the hot terminal 1 connected through the switch first and then through the load back to the neutral or grounded terminal 2. FIG. 6 shows an N type AC switch configuration with the hot wire 1 connected first through the load and then through the switch back to ground or neutral terminal 2.

In a typical embodiment of FIG. 3, the ON/OFF switch 10 is a transistor which may be triggered into conduction by a control signal or the like from a variety of sources depending upon the application. One typical application is in proximity sensing where the control signal generated from a proximity sensor is used to trigger transistor switch 10 into conduction. Current flows through transistor 10 first and then through the load.

If it is desired to convert the switch of FIG. 3 to an N type DC configuration as shown in FIG. 4, the installer cannot merely reverse the connection of terminals 1 and 2 across the power supply in order to have the current flow first through the load. If the connection of terminals 1 and 2 in FIG. 3 is reversed, current will not flow in the reverse direction through transistor 10. Thus a separate dedicated switch must be used to achieve the switch configuration of FIG. 4.

The P type AC switch configuration of FIG. 5 may be converted to the N type AC switch configuration of FIG. 6 merely by reversing the connection of terminals 1 and 2. This is because the ON/OFF switch 12, such as a triac, is bidirectional to conduct the AC current. Thus, a single switch module may service both the P type AC and the N type AC configurations of FIGS. 5 and 6.

It is thus seen that in order to service all four of the switching configurations of FIGS. 3 through 6, a total of three switch modules are necessary. A first switch module services the P type DC switch configuration of FIG. 3. A second different switch module services the N type DC switch configuration of FIG. 4. A third switch module services both the P type AC and the N type AC switch configurations of FIGS. 5 and 6.

FIG. 7 shows a basic building block switching structure useful for teaching the present invention. The same 3-wire numeration is used as before for clarity. First and second main terminals 1 and 2 are provided for connection to either an AC or DC power source, and terminal 2 may be either grounded or neutral. A third load terminal is provided for connection to a load 20. A diode rectifier bridge 22 is connected at its AC inputs 24 and 26 between the first and third terminals 1 and 3. A switching transistor 28 is connected between the DC outputs 30 and 32 of bridge 22. Transistor 28 may be a FET or bipolar of either polarity. In one embodiment, transistor 28 is a PNP transistor with its emitter connected to the positive DC output 30 of the bridge and its collector connected to the negative DC output 32 of the bridge. Load 20 may be connected to terminal 2 or grounded if terminal 2 is grounded.

In operation the switch module of FIG. 7 services the P type DC switch configuration by connecting terminal 1 to the positive side of a DC power source and connecting terminal 2 to the negative side of a DC power source. Current flows from terminal 1 to the positive DC output 30 of the bridge, then through transistor 28 when triggered by gate or base drive on trigger line 34, then to the negative DC output 32 of the bridge, then through load 20 back to ground or to terminal 2.

The switch module of FIG. 7 services the N type DC switch configuration by connecting terminal 2 to the positive side of the DC power source and connecting terminal 1 to the negative side of the DC power source. Current then flows from terminal 2 through load 20 to the positive DC output 30 of the bridge then through transistor 28 when triggered ON, then to negative DC output 32 then to terminal 1.

The switch module in FIG. 7 services the P type AC configuration by connecting terminal 1 to the hot side of an AC power source and connecting terminal 2 to the neutral side of the AC power source. In the first half cycle with terminal 1 swinging positive relative to terminal 2, current flows from terminal 1 to the positive DC output 30 of the bridge then through transistor 28 when triggered ON, then to negative DC output terminal 32 then through load 20 back to terminal 2 and/or to ground. In the other half cycle, with terminal 1 swinging negative relative to grounded or neutral terminal 2, current flows from terminal 2 through load 20 to the positive DC bridge output 30, which is at ground or neutral, then through transistor 28 to negative DC bridge output 32, then back to terminal 1.

The switch module of FIG. 7 services the N type AC configuration by connecting terminal 1 to the neutral side of the AC power source and connecting terminal 2 to the hot side of the AC power source, with operation comparable to that above described.

All four configurations are thus furnished by a single universal switch module as wire programmed at installation, and affording field convertibility between the configurations without internal changes to the switch module. The installer merely programs the configuration according to installation wired connection of terminals 1, 2 and 3.

In order to afford short circuit and overload protection, it is necessary that nonlatching switch means such as transistor 28 be used within the bridge. A nonlatching switch stops conducting when the trigger or control signal is terminated. A latching type switching device, such as an SCR or a triac, is not amenable to short circuit and overload protection because these types of switches remain conducting in DC modes even after termination of the trigger signal, as long as a sufficient holding current flows through the main electrodes. In AC applications, even after termination of the trigger signal, the latching switch will remain conducting until the end of the half cycle, i.e. until the next zero crossing of the current through the main electrodes. Turn-off must be effected much faster than this, especially for a 60 hertz cycle, to protect the switching device from destruction due to overload or short circuit current.

The triggering of transistor 28 presents practical problems, particularly in a hardwired trigger connection embodiment. For example, if a triggering voltage source is referenced to one of the lines 1 or 2, the switch module of FIG. 7 will not work in practical applications of all the configurations of FIGS. 3 through 6. This is because the reference level changes when the installation connection of lines 1 and 2 is reversed to convert between P and N type configurations. This changing reference level for the trigger circuitry is accommodated in prior devices by using dedicated switch modules appropriately referenced.

FIG. 8 shows a universal 3-wire switch module 40 in its preferred construction in accordance with the invention, including the triggering circuitry 36 of FIG. 7. In FIG. 8, switch circuit 40 has first and second main terminals 1 and 2, and a third load terminal 3 for connection to load 20 as before. Like reference numerals from FIG. 7 are used where appropriate in FIG. 8 to facilitate clarity. Trigger circuit 36 thus affords the triggering base drive on line 34 to the load transistor switch 28 in bridge 22.

Circuit 40 includes an input diode bridge rectifier 42 connected between the power lines at input terminals 44 and 46 of the bridge. Bridge 42 thus has positive and negative DC output terminals 48, and 50, respectively. "Rectified line current" shall mean the DC current at terminal 48 or 50, derived from power lines 1 and 2, regardless of whether the power lines 1 and 2 are AC or DC biased. Input switch means, such as input transistor 52, is connected to the input bridge rectifier 42 and passes rectified line current therethrough from the bridge under control of signal 54.

In one particularly desirable aspect of the invention, the preferred construction accommodates a control signal 54 which is not matched to the load control requirements. For example, the voltage levels available in control signal 54 may not be great enough to meet the triggering requirements for load control transistor switch 28 which must withstand large voltage swings across the power lines 1 and 2. Power supply or voltage setting means 56 is provided between the DC outputs 48 and 50 of the auxiliary or input bridge 42. This voltage setting or power supply means includes a zener diode 58 and a resistor 60 connected in series between points 48 and 50, and a storage capacitor 62 connected in parallel with zener diode 58. In one particular application, the zener diode 58 is selected to yield a 7.5 voltage supply between points 65 and 50. In the noted particular application, this voltage is provided on terminals 66 and 67 and is the power supply for a proximity sensor which outputs a 7.5 volt control signal 54 on line 64 in response to the given sensed condition, and outputs a zero volt signal in the absence of the given condition. This control signal 54 on line 64 is referenced to a point within bridge 42, preferably negative DC point 50, to be described more fully hereinafter. This referencing within the bridge provides automatic intelligent reference level transfer such that the control signal's reference follows either the more positive or the more negative polarity of terminals 1 or 2, regardless of the above-noted P or N type configuration.

NPN input transistor 52 has its collector connected through resistor 60 to the positive DC output terminal 48 of the bridge, and has its base connected to a signal line 64. Input transistor 52 is thus in a normally blocking OFF state in the absence of signal 54, and is driven into conduction in response to the presence of signal 54, which conduction passes rectified line current from terminal 48 through transistor 52.

The input switch means may alternatively or additionally include PNP transistor 68 having its base connected through resistor 69 to signal line 64 and also connected through resistor 70 to the negative DC output terminal 50 of bridge 42. The emitter of transistor 68 is connected through resistor 60 to the positive DC output terminal 48 of the bridge. PNP transistor 68 is thus in a normally conductive ON state in the absence of signal 54 due to the positive biasing of its emitter-base junction from positive DC terminal 48 through the emitter-base junction of transistor 68 which is return referenced through resistor 70 to negative DC terminal 50. In response to the presence of signal 54, transistor 68 is biased to its blocking OFF state and thus blocks the flow of rectified line current therethrough from DC terminal 48.

Circuit 40 further includes conditioning means 72 conditioning the rectified line current from input switch means 52 to predetermined drive requirements. In preferred form, conditioning means 72 comprises a current source supplying a constant current drive on line 34 for controlling load transistor switch 28. The preferred type of current source is a current mirror driven by the current on line 74 through resistor 76 from transistor 52, and outputting a predetermined proportional level drive current on line 34.

Current mirrors are known in the art, and will be only briefly described. Current mirror 72 comprises one or more left-hand transistors 78 base driven by the current on line 74 from input transistor 52 and passing rectified line current from input transistor 52 through transistor 78 back to a return point, negative DC terminal 50 of bridge rectifier 42. The current mirror further includes one or more right-hand transistors 80 base driven in common with the left-hand transistor 78 from input transistor 52, and passing drive current on line 34 therethrough to return point 50 of bridge rectifier 42.

Transistor 78 is an NPN transistor having its collector and base connected to line 74 from the emitter of transistor 52. Transistor 80 is an NPN transistor having its base connected to line 74, and its collector connected to line 34. The emitters of transistors 78 and 80 are connected through respective resistors 82 and 84 to a common point 86 which is connected to return point 50 of bridge 42.

In operation, a current $I_1$ flows through lefthand transistor 78, and a current $I_2$ flows through the right-hand transistor 80. Between common base point 88 and common emitter point 86, there are two parallel circuit branches. The left-hand circuit branch is through the base-emitter junction of transistor 78 and through resistor 82. The right-hand circuit branch is through the base-emitter junction of transistor 80 and through resistor 84. The voltage drop through each branch between points 88 and 86 is identical since the branches are in parallel. The voltage drop across the left branch is the base to emitter drop of transistor 78 plus the IR drop across resistor 82, as shown in equation 1 for the voltage across points 88 and 86.

$$V_{88-86} = V_{BE78} + I_1 R_{82} \tag{1}$$

Likewise, the voltage drop through the right-hand branch is the base to emitter drop of transistor 80 plus the drop across resistor 84, as shown in equation 2.

$$V_{88-86} = V_{BE80} + I_2 R_{84} \tag{2}$$

Inserting equation 1 into equation 2 to set the voltage drops equal results in equation 3.

$$V_{BE78} + I_1 R_{82} = V_{BE80} + I_2 R_{84} \tag{3}$$

The base to emitter voltage drops are negligible compared to the IR drops across the resistors, particularly for larger size resistors. Eliminating the base to emitter voltage drops in equation 3 results in equation 4.

$$I_1 R_{82} = I_2 R_{84} \tag{4}$$

Solving equation 4 for $I_2$ yields equation 5.

$$I_2 = I_1 (R_{82} / R_{84}) \tag{5}$$

Conditioning circuit 72 thus pulls an amount of current $I_2$ from line 34 which is a mirror of the amount of current $I_1$ on line 74 multiplied by a given constant, namely the ratio of the resistance values of resistors 82 and 84.

As above noted, switch 40 includes an output diode bridge rectifier 22, connected in series with load 20 between power lines 1 and 2. Transistor 28 is driven by conditioning means 72 to an ON state passing line current through load 20. In preferred form, load transistor 28 is a PNP transistor having its base connected to line 34, and its emitter and collector connected to the respective positive and negative DC output terminals 30 and 32 of bridge 22.

In operation, the constant current pulled through transistor 80 from line 34 supplies the base drive for transistor 28 to turn the latter ON and allow line current, whether AC or DC, to pass through load 20. Furthermore, switch module 40 may be connected in any of the configurations in FIGS. 3 through 6. In the absence of signal 54, transistor 52 is OFF, whereby transistors 78 and 80 are OFF, and hence there is no driving base current for transistor 28, whereby the latter is in an OFF state blocking line current flow through load 20.

Load 20 thus is operated in a normally open (NO) mode.

Another load 90 may alternatively or additionally be operated in a normally closed (NC) mode. In response to the absence of gate signal 54, input transistor 68 is ON, whereby rectified line current is supplied from positive DC terminal 48 of bridge 42 to line 92 through resistor 94. A second conditioning circuit 96 is provided, comparable to conditioning circuit 72. A predetermined proportional level constant drive current is thus afforded on output line 98 which supplies the base drive for a second load transistor 102. Transistor 102 is connected in a second output diode bridge rectifier 104 which is connected at its AC inputs between first terminal 1 and another third terminal 3a. In the absence of signal 54, load transistor 102 is thus base driven into a conductive ON state to pass line current, whether AC or DC, through load 90. Load 90 is thus operated in a normally closed (NC) mode with switch module 40 connected in any of the configurations of FIGS. 3 through 6.

It is recognized that various modifications are possible within the scope of the appended claims.

We claim:

1. A universal 3-wire switch module adapted to have a first P type DC configuration, a second N type DC configuration, a third P type AC configuration and a fourth N type AC configuration as programmed by installation wire connection, without internal changes to the switch module, comprising:
   first and second main terminals for connection to either an AC or DC power source;
   a third load terminal for connection to a load, said load being further connected to one of said first and second main terminals;
   a rectifier bridge connected at its AC inputs between said first and third terminals;
   nonlatching switching means connected to said bridge for blocking and passing current therethrough for controlling energization of said load;
   trigger means for controlling the conduction state of said switch means;
   said switch module having said first P type DC configuration when said first terminal is connected to the positive side of a DC power source and said second terminal is connected to the negative side of the DC power source;
   said switch module having said second N type DC configuration when said first terminal is connected to the negative side of a DC power source and said second terminal is connected to the positive side of the DC power source;
   said switch module having said third P type AC configuration when said first terminal is connected to the hot side of AC power source and said second terminal is connected to the neutral side of the AC power source;
   said switch module having said fourth N type AC configuration when said first terminal is connected to the neutral side of an AC power source and said second terminal is connected to the hot side of the AC power source;
   said first, second, third and fourth configurations are furnished by a single universal said switch module as wire programmed at installation, and affording field convertibility between said first, second, third and fourth configurations without internal changes to said switch module.

2. The invention according to claim 1 wherein said switching means comprises nonlatching transistor means connected between the DC outputs of said bridge.

3. The invention according to claim 2 wherein said trigger means comprises a trigger current means connected to said transistor means.

4. The invention according to claim 3 wherein said trigger current means comprises:
   an input rectifier bridge, connected at its AC inputs between said first and second terminals;
   input switch means connected to said input bridge for passing rectified line current therethrough from said input bridge; and
   conditioning means having an input connected to said input switch means for conditioning said rectified line current, and having an output connected to said transistor means for biasing the latter into conduction.

5. The invention according to claim 4 wherein said input switch means comprises transistor means having one of its emitter and collector connected to one of the DC outputs of said input bridge, and wherein said conditioning means comprises current source means having an input connected to the other of said emitter and collector of said last mentioned transistor means and having a return reference connection to the other DC output of said input bridge.

6. The invention according to claim 5 wherein said trigger current means further comprises voltage setting means connected between the DC outputs of said input bridge for establishing a given voltage thereacross.

7. The invention according to claim 6 wherein said voltage setting means comprises a zener diode and a resistor connected in series between said DC outputs of said input bridge, and a capacitor connected in parallel with said zener diode.

8. The invention according to claim 5 wherein said current source means comprises a current mirror having one branch connected to said other of said emitter and collector of said second mentioned transistor means, and having another branch connected to the base of said first mentioned transistor means.

9. A universal 3-wire switch module for normally open load control, adapted to have a first P type DC configuration, a second N type DC configuration, a third P type AC configuration and a fourth N type AC configuration as programmed by installation wire connection, without internal changes to the switch module, comprising:
   first and second main terminals for connection to either an AC or DC power source;
   a third load terminal for connection to a load, said load being further connected to one of said first and second main terminals;
   a rectifier bridge connected at its AC inputs between said first and third terminals;
   nonlatching transistor means connected between the DC outputs of said bridge for blocking and passing current therethrough for controlling energization of said load;
   trigger means for driving said transistor means into conduction to pass current therethrough and through said load;
   said switch module being normally open and having said first P type DC configuration when said first terminal is connected to the positive side of a DC power source and said second terminal is connected to the negative side of the DC power source;

said switch module being normally open and having said second N type DC configuration when said first terminal is connected to the negative side of a DC power source and said second terminal is connected to the positive side of the DC power source;

said switch module being normally open and having said third P type AC configuration when said first terminal is connected to the hot side of an AC power source and said second terminal is connected to the neutral side of the AC power source;

said switch module being normally open and having said fourth N type AC configuration when said first terminal is connected to the neutral side of an AC power source and said second terminal is connected to the hot side of the AC power source;

such that said first, second, third and fourth normally open said configurations are furnished by a single universal said switch module as wire programmed at installation, and affording field convertibility between said configurations without internal changes to said switch module.

10. The invention according to claim 9 wherein said trigger means comprises:
an input rectifier bridge connected at its AC inputs between said first and second terminals;
input switch means connected to said input bridge for passing rectified line current therethrough; and
conditioning means having an input connected to said input switch means and having an output connected to said transistor means.

11. A universal 3-wire switch module for normally closed load control adapted to have a first P type DC configuration, a second N type DC configuration, a third P type AC configuration and a fourth N type AC configuration as programmed by installation wire connection, without internal changes to the switch module, comprising:
first and second main terminals for connection to either an AC or DC power source;
a third load terminal for connection to a load;
a rectifier bridge connected at its AC inputs between said first and third terminals;
nonlatching transistor means connected between the DC outputs of said bridge for blocking and passing current therethrough for controlling energization of said load;
trigger means for controlling the conduction state of said transistor means, comprising trigger current means connected to said transitor means to normally drive the latter into conduction to pass current therethrough and through said load, and comprising switch means switchable to an ON state to terminate base drive for said transistor means such that the latter turns OFF;
said switch module having said normally closed fist P type DC configuration when said first terminal is connected to the positive side of a DC power source and said second terminal is connected to the negative side of the DC power source;
said switch module having said normally closed second N type DC configuration when said first terminal is connected to the negative side of a DC power source and said second terminal is connected to the positive side of the DC power source;
said switch module having said normally closed third P type AC configuration when said first terminal is connected to the hot side of an AC power source and said second terminal is connected to the neutral side of the AC power source;

said switch module having said normally closed fourth N type AC configuration when said first terminal is connected to the neutral side of an AC power source and said second terminal is connected to the hot side of the AC power source;

such that said first, second, third and fourth normally closed said configurations are furnished by a single universal said switch module as wire programmed at installation, and affording field convertibility between said configurations without-internal changes to said switch module.

12. The invention according to claim 11 wherein said trigger current means comprises:
an input rectifier bridge connected at its AC inputs between said first and second terminals, said switch means being connected to said input bridge for passing rectified line current therethrough; and
conditioning means having an input connected to said switch means for conditioning said rectified line current, and having an output connected to said transistor means.

13. A universal 3-wire switch module for both normally open and normally closed load control, and adapted to have a first P type DC configuration, a second N type DC configuration, a third P type AC configuration and a fourth N type AC configuration as programmed by installation wire connection, without internal changes to the switch module comprising:
first and second main terminals for connection to either an AC or DC power source;
a plurality of third load terminals, each for connection to a designated normally open or normally closed load;
a plurality of rectifier bridges, each connected at one of its AC inputs to said first terminal and connected at its other AC input to its respective said third terminal;
a plurality of nonlatching switching means, each connected between the DC outputs of its respective said bridge for blocking and passing current therethrough for controlling energization of its respective said load;
trigger means for controlling the conduction states of said plurality of nonlatching switching means;
said switch module having said first P type DC configuration when said first terminal is connected to the positive side of a DC power source nad said second terminal is connected to the negative side of the DC power source;
said switch module having said second N type DC configuration when said first terminal is connected to the negative side of a DC power source and said second terminal is connected to the positive side of the DC power source;
said switch module having said second N type DC configuration when said first terminal is connected to the negative side of a DC power source and said second terminal is connected to the positive side of the DC power source;
said switch module having said third P type AC configuration when said first terminal is connected to the hot side of an AC power source and said second terminal is connected to the neutral side of the AC power source;

said switch module having said fourth N type AC configuration when said first terminal is connected to the neutral side of an AC power source and said second terminal is connected to the hot side of the AC power source;

such that said first, second, third and fourth configurations are furnished by a single universal said switch module as wire programmed at installation, and affording field convertibility between said configurations without internal changes to said switch module.

14. The invention according to claim 13 wherein said plurality of nonlatching switching means comprise a plurality of load transistors, and wherein said trigger means comprises trigger current means connected to said transistors for biasing them into conduction to pass current therethrough and through their respective said loads, and comprising a plurality of input switch means switchable to an ON state to furnish base drive for normally open load mode transistors and to terminate base drive for normally closed load mode transistors.

15. The invention according to claim 14 wherein said trigger current means further comprises an input bridge rectifier connected at its AC inputs between said first and second terminals, said input switches being connected to said input bridge to pass rectified line current therethrough, and comprising conditioning means having inputs connected to said input switches for conditioning said rectified line current and having outputs connected to said load transistors.

16. The invention according to claim 15 wherein said input switches comprise input transistors each having one of its base and emitter connected to one of the DC outputs of said input bridge, and wherein said conditioning means comprises a plurality of current source means each having an input connected to the other of the emitter and collector of its respective said input transistor and having an output connected to the base of its respective said load transistor.

17. The invention according to claim 16 wherein each of said current source means comprises a current mirror having one branch connected to said other of said emitter and collector of its respective said input transistor and having another branch connected to said base of its respective said load transistor, and having a return reference connection to the other DC output of said input bridge.

18. The invention according to claim 17 wherein said trigger current means further comprises voltage setting means connected between said DC outputs of said input bridge to establish a given voltage thereacross.

19. The invention according to claim 18 wherein said voltage setting means comprises a zener diode connected in series between said DC outputs of said input bridge, and a capacitor connected in parallel with said zener diode.

20. The invention according to claim 19 wherein the bases of said input transistors are connected in common and referenced through a resistor to said other DC output of said input bridge.

21. A wide range universal AC-DC output switch circuit for controlling one or more loads between a pair of power lines, comprising:
input bridge rectifier means connected between said power lines;
input switch means connected to said bridge rectifier means and passing rectified line current therethrough from said input bridge rectifier means under control of a control signal;
conditioning means conditioning said rectified line current from said input switch means to predetermined drive requirements, said conditioning means comprises current source means supplying constant current drive for actuating said load switch means, said current source means comprises a current mirror driven by said rectified line current from said input switch means, and outputting a predetermined proportional level drive current to actuate said load switch means,
output bridge recitifier means connected in series with one said load between said power lines; and
load switch means connected to said output bridge recitifier means and driven by said conditioning means to an ON state passing line current through said load, and having an OFF state blocking line current flow through said load.

22. The invention according to claim 21 wherein said input switch means is in a normally blocking OFF state in the absence of said signal, such that said load switch means is normally open.

23. The invention according to claim 21 wherein said input switch means is in a normally conducting ON state in the absence of said signal, such that said load switch means is normally closed.

24. The invention according to claim 21 comprising:
second input switch means connected to said input bridge rectifier means and passing rectified line current therethrough from said input bridge rectifier means under control of said signal;
second conditioning means conditioning said rectified line current from said second input switch means to predetermined drive requirements;
second output bridge rectifier means connected in series with another said load between said power lines; and
second load switch means connected to said second output bridge rectifier means and driven by said second conditioning means to an ON state passing line current through said other load, and having an OFF state blocking line current flow through said other load;
said first and second input switch means having gate inputs connected in common to a line carrying said signal, one of said input switch means being actuated by said signal to a conductive ON state and the other of said input switch means being actuated by said signal to a blocking OFF state, such that one of said load switch means is normally open and the other of said load switch means is normally closed in the absence of said signal.

25. A wide range universal AC-DC output switch circuit for controlling one or more loads between a pair of power lines, comprising:
input bridge rectifier means connected between said power lines;
input transistor means base driven by a control signal for controlling conduction of rectified line current therethrough from said input bridge rectifier means;
current mirror means driven by said rectified line current from said input transistor means and outputting a predetermined proportional level drive current;
output bridge rectifier means connected in series with one said load between said power lines; and load transistor means base driven by said drive current from said current mirror means to an ON state passing line current through said load, and having an OFF state blocking line current flow through said load.

26. The invention according to claim 25 wherein said current mirror means comprises:
left-hand transistor means base driven by said input transistor means and passing rectified line current from said input transistor means back to a return point to said input bridge rectifier means; and
right-hand transistor means base driven in common with said left-hand transistor means from said input transistor means, and passing said drive current therethrough between the base of said load transistor means and said return point to said input bridge rectifier means.

27. The invention according to claim 26 wherein:
said input bridge rectifier means has a pair of input terminals each connected to a respective one of said power lines, and has a pair of DC output terminals;
said input transistor means has one of its emitter and collector connected to one of said DC output terminals of said input bridge rectifier means;
the base of said left-hand transistor and the base of said right-hand transistor of said current mirror means are connected in common to the other of said emitter and collector in common to the other of said emitter and collector of said input transistor means;
said left-hand transistor means has one of its emitter and collector connected to said other of said emitter and collector of said input transistor means;
said right-hand transistor means has one of its emitter and collector connected to said base of said load transistor means;
the other of said emitter and collector of said left-hand transistor means and the other of said emitter and collector of said right-hand transistor means are connected through respective resistors to a common point which is connected to the other of said DC output terminals of said input bridge rectifier means;
said output bridge rectifier means has one input terminal connected to one of said power lines and another input terminal connected in series with said load to the other of said power lines, and has a pair of DC output terminals;
said load transistor means has one of its emitter and collector connected to one of said DC output terminals of said output bridge rectifier means and the other of its emitter and collector connected to the other of said DC output terminals of said output bridge rectifier means.

28. A wide range universal AC-DC output switch circuit for controlling at least two loads between a pair of power lines, comprising:
input bridge rectifier means connected between said power lines;
first input transistor means base driven by a control signal for controlling conduction of rectified line current therethrough from said input bridge rectifier means;
second input transistor means base driven by said signal for controlling conduction of rectified line current therethrough from said input bridge rectifier means;
first current mirror means driven by said rectified line current from said first input transistor means and outputting a predetermined proportional level drive current;
second current mirror means driven by said rectified line current from said second input transistor means and outputting a second predetermined proportional level drive current;
first output bridge rectifier means connected in series with one said load between said power lines;
first load transistor means base driven by said first drive current from said first current mirror means to an ON state passing line current through said one load, and having an OFF state blocking line current flow through said one load;
second output bridge rectifier means connected in series with a second said load between said power lines; and
second load transistor means base driven by said second drive current from said current mirror means to an ON state passing line current through said second load, and having an OFF state blocking line current flow through said second load;
said first input transistor means being driven by the presence of said signal to a conductive ON state, and said second input transistor means being ON in the absence of said signal and being driven to a blocking OFF state in response to the presence of said signal, such that said first load transistor means is normally open and conductive and said second load transistor means is normally closed and blocking in the absence of said signal.

29. The invention according to claim 28 wherein said first current mirror means comprises:
first left-hand transistor means base driven by said first input transistor means and passing rectified line current from said first input transistor means back to a return point to said input bridge rectifier means; and
first right-hand transistor means base driven in common with said first left-hand transistor means from said first input transistor means, and passing said first drive current therethrough between the base of said first load transistor means and said return point to said input bridge rectifier means;
and wherein said second current mirror means comprises:
a second left-hand transistor means base driven by said second input transistor means and passing rectified line current from said second input transistor means back to a return point to said input bridge rectifier means; and
second right-hand transistor means base driven in common with said second left-hand transistor means from said second input transistor means, and passing said second drive current therethrough between the base of said second load transistor means and said return point to said input bridge rectifier means.

30. The invention according to claim 29 wherein:
said input bridge rectifier means has a pair of input terminals each connected to a respective one of said power lines, and has a pair of DC output terminals;
said first input transistor means has one of its emitter and collector connected to one of said DC output terminals of said input bridge rectifier means;

said second input transistor means has one of its emitter and collector connected to said one of said DC output terminals of said input bridge rectifier means;

the base of said first left-hand transistor and the base of said first right-hand transistor of said first current mirror means are connected in common to the other of said emitter and collector of said first input transistor means;

said first left-hand transistor means has one of its emitter and collector connected to said other of said emitter and collector of said first input transistor means;

said first right-hand transistor means has one of its emitter and collector connected to said base of said first load transistor means;

the other of said emitter and collector of said first left-hand transistor means and the other of said emitter and collector of said first right-hand transistor means are connected through respective resistors to a common point which is connected to the other of said DC output terminals of said input bridge rectifier means;

the base of said second left-hand transistor means and the base of said second right-hand transistor means of said second current mirror means are connected in common to the other of said emitter and collector of said second input transistor means;

said second left-hand transistor means has one of its emitter and collector connected to said other of said emitter and collector of said second input transistor means;

said second right-hand transistor means has one of its emitter and collector connected to said base of said second load transistor means;

the other of said emitter and collector of said second left-hand transistor means and the other of said emitter and collector of said second right-hand transistor means are connected through respective resistors to a common point which is connected to said other of said DC output terminals of said input bridge rectifier means;

said first output bridge rectifier means has one input terminal connected to one of said power lines and another input terminal connected in series with said one load to the other of said power lines, and has a pair of DC output terminals;

said second output bridge rectifier means has one input terminal connected to one of said power lines and another input terminal connected in series with said second load to the other of said power lines, and has a pair of DC output terminals;

said first load transistor means has one of its emitter and collector connected to one of said DC output terminals of said first output bridge rectifier means and the other of its emitter and collector connected to the other of said DC output terminals of said first output bridge rectifier means; and said second load transistor means has one of its emitter and collector connected to one of said DC output terminals of said second output bridge rectifier means and the other of its emitter and collector connected to the other of said DC output terminals of said second output bridge rectifier means.

31. A wide range universal AC-DC output switch circuit for controlling a load in a selectable normally open or normally closed mode between a pair of power lines in response to a control signal, comprising:

input bridge rectifier means connected between said power lines;

first input switch means connected to said bridge rectifier means and having an OFF state in the absence of said signal, and passing rectified line current therethrough from said input bridge rectifier means in response to the presence of said signal;

second input switch means connected to said bridge rectifier means and having a normally conductive ON state passing rectified line current therethrough from said input bridge rectifier means in the absence of said signal, and having a blocking OFF state in response to the presence of said signal;

first conditioning means conditioning said rectified line current from said first input switch means to predetermined drive requirements;

second conditioning means conditioning said rectified line current from said second input switch means to predetermined drive requirements;

output bridge rectifier means connected in series with said load between said power lines; and load switch means connected to said output bridge rectifier means and selectively connectable to one of said conditioning means to be driven thereby to an ON state passing line current through said load, and having an OFF state blocking line current flow through said load, said load being in a normally open mode when said load switch means is connected to said first conditioning means, and said load being in a normally closed mode when said load switch means is connected to said second conditioning means.

32. The invention according to claim 31 wherein each said conditioning means comprises a current mirror driven by said rectified line current from the respective said input switch means, and outputting a predetermined proportional level drive current to actuate said load switch means.

33. The invention according to claim 32 wherein:

said input bridge rectifier means has a pair of input terminals each connected to a respective one of said power lines, and has positive and negative DC output terminals;

said first input switch means comprises an NPN transistor having its base driven by said signal, its collector connected to said positive DC terminal of said input bridge rectifier means, and its emitter connected to said current mirror of said first conditioning means;

said second input switch means comprises a PNP transistor having its base driven by said signal and also connected through a resistor to said negative DC output terminal of said input bridge rectifier means, its emitter connected to said positive DC output terminal of said input bridge rectifier means, and its collector connected to said current mirror of said second conditioning means.

34. A wide range universal AC-DC output switch circuit for controlling one or more loads between a pair of power lines in response to a control signal, comprising:

input diode bridge rectifier means having a pair of input terminals each connected to a respective one of said power lines, and having positive and negative DC output terminals;

an input transistor base driven under control of said signal to pass rectified line current therethrough from one of said DC output terminals;

a current mirror driven by said rectified line current from said input transistor and returning said rectified line current therethrough to the other of said DC output terminals of said input bridge rectifier means, said current mirror pulling a predetermined proportional level drive current therethrough from an output line to said other DC output terminal of said input bridge rectifier means;

output bridge rectifier means having one input terminal connected to one of said power lines and another input terminal connected in series with said load to the other of said power lines, and having positive and negative DC output terminals; and a PNP load transistor having its emitter connected to said positive DC output terminal and its collector connected to said negative DC output terminal of said output bridge rectifier means, and having its base connected to said output terminal of said current mirror.

35. The invention according to claim 34 wherein said input transistor is an NPN transistor having its base driven by said signal, its collector connected to said positive DC output terminal of said input bridge rectifier means, and its collector connected to the input to said current mirror.

36. The invention according to claim 34 wherein said input transistor comprises a PNP transistor having its base driven by said signal and also connected through a resistor to said negative DC output terminal of said input bridge rectifier means, having its emitter connected to said positive DC output terminal of said input bridge rectifier means, and having its collector connected to the input to said current mirror.

37. The invention according to claim 34 wherein said current mirror comprises:

left-hand NPN transistor means having its collector and base connected to said input transistor means, and its emitter connected through a resistor to said negative DC output terminal of said input bridge rectifier means; and right-hand NPN transistor means having its collector connected to said base of said load transistor, its base connected to said input transistor, and its emitter connected through a resistor to said negative DC output terminal of said input bridge rectifier means.

38. A wide range universal AC-DC output switch circuit for controlling one or more loads between a pair of power lines, comprising:

input bridge rectifier means having a pair of input terminals each connected to a respective one of said power lines, and positive and negative DC output terminals;

an NPN input transistor having its base driven by a control signal, and its collector connected to said positive DC output terminal of said input bridge rectifier means;

a PNP input transistor having its base driven by said signal and also connected through a resistor to said negative DC output terminal of said input bridge rectifier means, and having its emitter connected to said positive DC output terminal of said input bridge rectifier means;

a first current mirror comprising:

first left-hand NPN transistor means having its base and collector connected to the emitter of said NPN input transistor, and its emitter connected through a resistor to said negative DC output terminal of said input bridge rectifier means; and first right-hand transistor means having its base connected to said emitter of said NPN input transistor, and its emitter connected through a resistor to said negative DC output terminal of said input bridge rectifier means; a second current mirror comprising:

second left-hand NPN transistor means having its base and collector connected to the collector of said PNP input transistor, and its emitter connected through a resistor to said negative DC output terminal of said input bridge rectifier; and second right-hand transistor means having its base connected to said collector of said PNP input transistor, and its emitter connected through a resistor to said negative DC output terminal of said input bridge rectifier;

a first output diode bridge rectifier having one input terminal connected to one of said power lines and another input terminal connected in series with one said load to the other of said power lines, and having positive and negative DC output terminals;

a first PNP load transistor having its base connected to the collector of said first right-hand NPN transistor means of said first current mirror, its emitter connected to said positive DC output terminal of said first output bridge rectifier, and its collector connected to said negative DC output terminal of said first output bridge rectifier;

a second output diode bridge rectifier having one input terminal connected to one of said power lines and another input terminal connected in series with another said load to the other of said power lines, and having positive and negative DC output terminals, and a second PNP load transistor having its base connected to the collector of said second NPN right-hand transistor means of said second current mirror, its emitter connected to said positive DC output terminal of said second output bridge rectifier, and its collector connected to said negative DC output terminal of said second output bridge rectifier.

39. The invention according to claim 38 wherein said universal switch circuit has first and second terminals for connection to said power lines;

said universal switch circuit being P type DC configuration when said first terminal is connected to the positive side of a DC power source and said second terminal is connected to the negative side of the DC power source;

said universal switch circuit being N type DC configuration when said first terminal is connected to the negative side of a DC power source and said second terminal is connected to the positive side of the DC power source;

said universal switch circuit being P type AC configuration when said first terminal is connected to the hot side of an AC power source and said second terminal is connected to the neutral of the AC power source;

said universal switch circuit being N type AC configuration when said first terminal is connected to the neutral side of an AC power source and said second terminal is connected to the hot side of the AC power source;

such that all four said configurations are furnished by a single universal said switch circuit as wire programmed at installation, and affording field convertibility between said configurations without internal changes to said universal switch circuit.

* * * * *